United States Patent [19]
Link

[11] Patent Number: 5,850,409
[45] Date of Patent: Dec. 15, 1998

[54] LASER MODULATION CONTROL METHOD AND APPARATUS

[75] Inventor: Garry N. Link, Aloha, Oreg.

[73] Assignee: Maxim Integrated Products, Inc., Sunnyvale, Calif.

[21] Appl. No.: 822,622

[22] Filed: Mar. 21, 1997

[51] Int. Cl.$^6$ .................................................. H01S 3/00
[52] U.S. Cl. ........................... 372/38; 372/25; 372/26; 372/28; 372/43
[58] Field of Search ................................. 372/9, 25, 26, 372/28, 29, 30, 31, 33, 38, 43, 50, 109

[56] References Cited

U.S. PATENT DOCUMENTS

| | | | |
|---|---|---|---|
| 4,359,773 | 11/1982 | Swartz et al. | 372/26 |
| 4,385,387 | 5/1983 | Trimmel | 372/29 |
| 4,924,470 | 5/1990 | Ries | 372/26 |
| 4,995,045 | 2/1991 | Bruley et al. | 372/38 |
| 5,187,713 | 2/1993 | Kwa | 372/26 |
| 5,394,416 | 2/1995 | Ries | 372/26 |
| 5,402,433 | 3/1995 | Stiscia | 372/31 |
| 5,526,164 | 6/1996 | Link et al. | 359/187 |
| 5,557,445 | 9/1996 | Misaizu | 372/38 X |
| 5,732,096 | 3/1998 | Suzuki et al. | 372/38 |

FOREIGN PATENT DOCUMENTS

| | | | |
|---|---|---|---|
| 0343725 | 11/1989 | European Pat. Off. | 385/88 X |

OTHER PUBLICATIONS

"A Versatile Si–Bipolar Driver Circuit with High Output Voltage Swing for External and Direct Laser Modulation in 10 Gb/s Optical–Fiber Links", Rein et al., IEEE Journal of Solid–State Circuits, vol. 29, No. 9, Sep. 1994.

"A Speed, Power and Supply Noise Evaluation of ECL Driver Circuits", Jouppi et al., IEEE Journal of Solid–State Circuits, vol. 31, No. 1, Jan. 1996.

Sony CXB1108AQ Laser Driver Data Sheet (No date of publication).

Sony CBX1118AQ/1128AQ Laser Driver Data Sheet (No date of publication).

"Laser Level–Control Circuit For High–Bit–Rate Systems Using A Slope Detector", Smith, D.W., Electronics Letters, vol. 14 (1978).

"Simultaneous Feedback Control Of Bias And Modulation Currents For Injection Lasers", Chen, F.S., Electronics Letters, vol. 16, No. 1 (1980).

*Primary Examiner*—Brian Healy
*Attorney, Agent, or Firm*—Blakely, Sokoloff, Taylor & Zafman LLP

[57] ABSTRACT

Laser modulation control apparatus and methods which provide direct control of the transmitted optical extinction ratio of a semiconductor laser. A relatively low frequency and low amplitude pilot tone is superimposed on the signal used to drive the laser. Setting the amplitude of the pilot tone to a fixed fraction of the laser modulation current causes the transmitted optical power to vary a fixed fraction of the optical data amplitude at the pilot tone frequency. By using feedback to control the laser modulation current, the amplitude of the variation can be maintained at a desired value, which in turn maintains the transmitted optical data amplitude at a constant value, regardless of variations due to operating temperature or laser aging. A separate control loop is employed to maintain the average optical power at a fixed value. Since the optical data amplitude and the average optical power remain constant, the optical extinction ratio is also constant. Alternate embodiments are disclosed.

25 Claims, 6 Drawing Sheets

LASER MODULATION CONTROL METHOD AND APPARATUS

BACKGROUND OF THE INVENTION

1. Field of the Invention

This invention relates to the field of semiconductor laser modulation control.

2. Prior Art

Semiconductor laser modulation control is desired because the optical characteristics of semiconductor lasers typically used for optical data communications exhibit strong temperature dependence and long term degradation due to aging. Control can be achieved by maintaining the laser at a fixed temperature using a thermoelectric cooler. However this is an expensive solution, and generally will exhibit a substantial time to settle on first turn-on. It also does not compensate for variations due to aging. High frequency methods have also been used to provide modulation control ("Simultaneous Feedback Control of Bias and Modulation Currents for Injection Lasers," Chen, F. S., *Electronics Letters*, Vol. 16, Pgs. 7–8, 1980; U.S. Pat. No. 5,402,433, Stiscia, J. J., 1995), but these techniques require expensive high speed photodiodes, careful control of circuit parasitics, and complex, high frequency circuits with high power dissipation. Therefore, techniques have been implemented ("Laser Level-Control Circuit for High-Bit-Rate Systems Using a Slope Detector," Smith, D. W., *Electronics Letters*, Vol. 14, Pgs. 775–776, 1978; U.S. Pat. No. 4,385,387, Trimmel, H., 1981; "Laser Diode Modulation and Noise," Petermann, K., Kluwer Academic Publishers, Pgs. 300–302, 1991; U.S. Pat. No. 5,557,445, Misaizu) by superimposing a low frequency pilot tone onto the laser current and detecting the nonlinearities associated with the lasing threshold. The laser is then operated with the optical zero level at or near the threshold. Operating near the threshold is not desirable due to increased laser noise, turn-on delay, and chirp. Improvements of this technique have been made by Burley (U.S. Pat. No. 4,995,045), but the method directly controls the optical data amplitude. Burley's circuit includes additional components to avoid multiple operating points or latch-up, but the transfer function of modulation current to ripple amplitude remains non-monotonic. Recent methods patented by Ries (U.S. Pat. Nos. 5,394,416 and 4,924,470) provide direct control of extinction ratio by measuring the intermodulation products of two low level pilot tones superimposed on the laser current. Ries discusses the merits of several automatic modulation control techniques, including pilot tone methods (see U.S. Pat. No. 5,394,416 for a more detailed discussion).

In the present invention, due to the fact that the pilot tone is inserted as part of the modulation current, and is a fixed fraction of the modulation current, Ries' objections about additional high speed circuitry and difficult phase matching are overcome. The method used by Ries does provide direct control of extinction ratio, but the circuit is far more complex than the present invention.

BRIEF SUMMARY OF THE INVENTION

The present invention is laser modulation control apparatus and methods which provide direct control of the transmitted optical extinction ratio of a semiconductor laser. In accordance with the invention, a relatively low frequency and low amplitude pilot tone is superimposed on the signal used to drive the laser. By setting the amplitude of the pilot tone to be a fixed fraction of the laser modulation current, the transmitted optical power varies a fixed fraction of the optical data amplitude at the pilot tone frequency. By using feedback to control the laser modulation current, the amplitude of the variation can be maintained at a desired value, which in turn maintains the transmitted optical data amplitude at a constant value, regardless of variations due to operating temperature or laser aging.

A separate control loop is employed to maintain the average optical power at a fixed value. Since the optical data amplitude and the average optical power remain constant, the optical extinction ratio is also constant. Because low frequency signal processing is used to determine the high frequency data amplitude, the transmitter bit rate is not limited by the automatic modulation control circuitry. An advantage of this method is that the absolute amplitude of the pilot tone is not important since the technique relies on the relative amplitude between the pilot tone and the modulation current. Therefore, there is no need for precision amplitude control of the pilot tone oscillator.

The present invention is further refined by applying the pilot tone in such a way that the amplitude of the optical power variation remains monotonic as the modulation current is increased beyond the lasing threshold. By keeping this transfer function monotonic, multiple operating points or latch-up are not possible.

Therefore, objectives of the present invention include providing circuits and methods which provide laser modulation control at high bit rates and:

1. Do not require high speed photodiodes and detection circuitry
2. Avoid the laser threshold region because of degraded laser performance in this region
3. Provide direct control of extinction ratio by maintaining a constant optical data amplitude
4. Do not require additional high speed circuitry for the injection of the pilot tone
5. Minimize circuit complexity

DETAILED DESCRIPTION OF THE INVENTION

Figure 1:
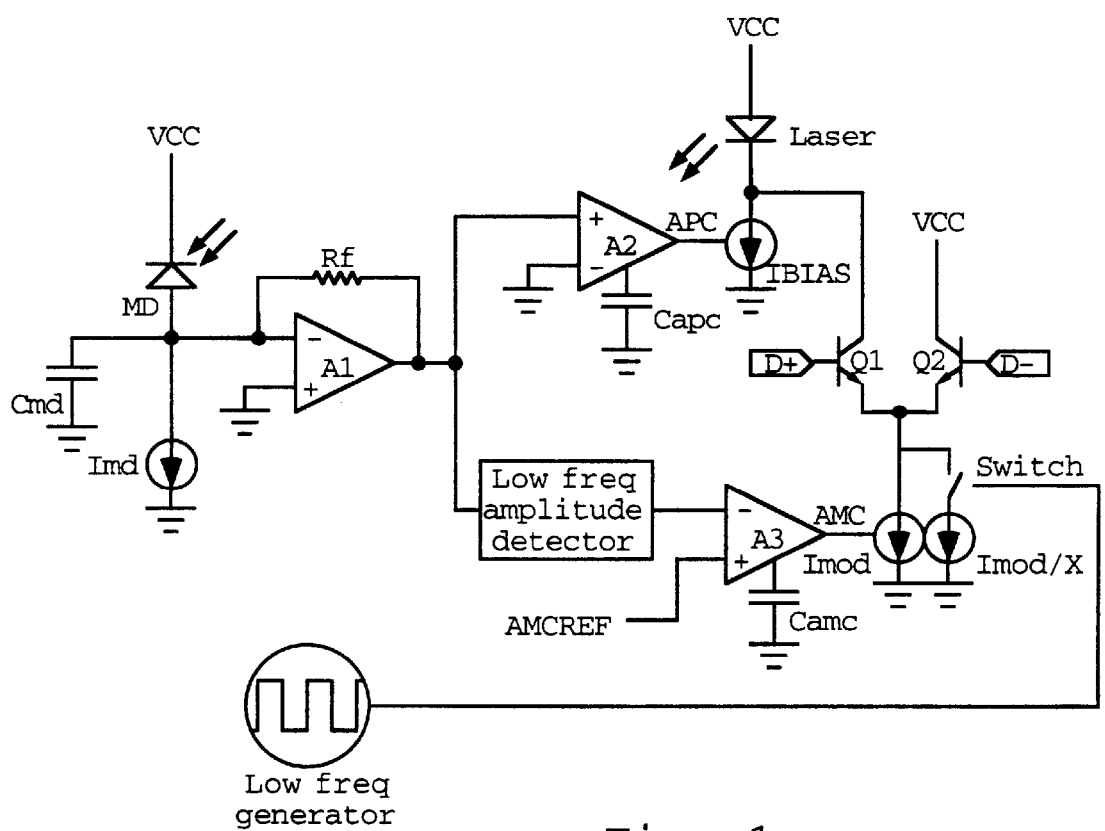
FIG. 1 is a schematic diagram of one embodiment of the present invention.

First referring to FIG. 1, a schematic diagram of one embodiment of the present invention may be seen. As shown therein, with the switch open as shown, a semiconductor LASER is driven with a bias current IBIAS, plus a modulation current Imod dependent on the state of a double ended input data signal D+, D−. If the data is a logic one (a higher voltage on input D+ holding transistor Q1 on, pulling the common emitter connection of transistors Q1 and Q2 up so that the lower voltage on input D− holds transistor Q2 off), the modulation current Imod will also pass through the laser as Q1 conducts. If the data is a logic zero, transistor Q1 will be off and transistor Q2 will be on. This directs Imod from the power supply VCC through transistor Q2, rather than through the laser and transistor Q1.

As may be seen in FIG. 1, an additional current Imod/X will be switched into the emitters of transistors Q1 and Q2, depending on the state of the relatively low frequency oscillator. The laser current is composed of IBIAS during zero data bits. During one data bits, the laser current is an envelope having a lower value of Imod+ IBIAS and a higher value of Imod+ IBIAS+ Imod/X, giving an average value of Imod+ IBIAS+ Imod/2X and an amplitude of the envelope variation of Imod/X. The minimum difference in the laser current between a logic zero and a logic one is Imod, and the average difference in the laser current between a logic zero and a logic one is Imod+ Imod/2X=Imod(1+1/2X)

If the laser operates exclusively in the linear region above the threshold, the optical signal emitted by the laser will have a zero level dependent on IBIAS, unaffected by the low frequency switching of Imod/X through transistor Q1. The difference in the optical output between a logic zero and a logic one input, whether considering the minimum difference or the average difference, will be proportional to Imod, and the variation in the optical output for a logic one input due to the low frequency switching of Imod/X through transistor Q1 will be proportional to Imod/X, which of course is proportional to Imod itself. Thus control of Imod to obtain a predetermined low frequency variation in the optical output of the laser simultaneously provides a predetermined difference in the optical output between a logic zero and a logic one input, without any high frequency control circuits and techniques being used. Also measuring the average optical output of the laser and controlling IBIAS in response to drive the average measured output to the desired output, the average optical output and the extinction ratio are directly controlled by simple, low frequency circuits.

In the foregoing overview of the function of the circuit of FIG. 1, it is apparent that it is important to be able to maintain the current source Imod/X at a fixed fraction 1/X of the current source Imod. This is easily done however, by use of a current mirror using transistors of different emitter area so that the current mirrored is a fixed fraction of the current in the mirroring transistor.

Having now given an overview of the purpose of the circuit of FIG. 1, the details thereof will now be described. A monitor photodiode MD detects a portion of the emitted optical signal from the laser and emits a photocurrent. The high frequency (data) information in the photocurrent is filtered by capacitor Cmd such that the remaining current is a DC current with the low frequency ripple. The desired DC monitor diode current is subtracted from the monitor diode current by a reference current source Imd. Transimpedance amplifier A1 with feedback resistor Rf converts the residual current (monitor photodiode current minus the current of reference current source Imd) into a voltage which is coupled to an automatic power control (APC) error amplifier A2 and a low frequency amplitude detector.

The error amplifier A2 has a positive gain, a direct coupled low pass output, and a cut off frequency set by compensation capacitor Capc at a frequency lower than that of the low frequency oscillator. With the negative feedback of amplifier A1, the output of amplifier A2 controls the value of Ibias such that the DC monitor photodiode current is equal to the desired current Imd. Thus the average optical signal emitted by the laser is held to a level providing an average illumination to the monitor photodiode to provide a current Imd there through. Note that the relationship between the laser current and the laser emission is monotonic, as is the relationship between the laser emission and the monitor current. Thus the average power control (APC) control loop has a single, easily stabilized operating point.

If the automatic power control (APC) loop described above is closed, the output of amplifier A1 will be a square wave at the low frequency oscillator frequency with amplitude ΔImd. The low frequency amplitude detector senses the amplitude of the low frequency ripple on the output of amplifier A1 and in response, couples a DC signal to the automatic modulation control (AMC) error amplifier A3 proportional to the ripple. For this purpose, the low frequency amplitude detector may be, by way of example, a rectifying circuit to provide a direct coupled signal proportional to the ripple in the output of amplifier A1.

Amplifier A3 compares the detected ripple amplitude ΔImd with the desired value as set by AMCREF (a DC reference voltage). Again using negative feedback, the output of A3 adjusts the modulation current Imod such that the ripple amplitude ΔImd is equal to AMCREF. The negative feedback in this case is not provided by amplifier A1, as the amplitude of the ripple as detected by the low frequency amplitude detector is not phase sensitive. Instead, the negative feedback is provided by amplifier A3, the input connections as shown in FIG. 1 decreasing Imod for increasing detected ripple. Capacitor Camc sets the frequency response of the AMC loop lower than the frequency response of the APC loop. In this manner, the APC loop always sets the DC optical power before the AMC loop sets the amplitude of the optical data signal, though of course both responding much faster than laser drift from temperature and aging variations of the laser.

Figure 2:
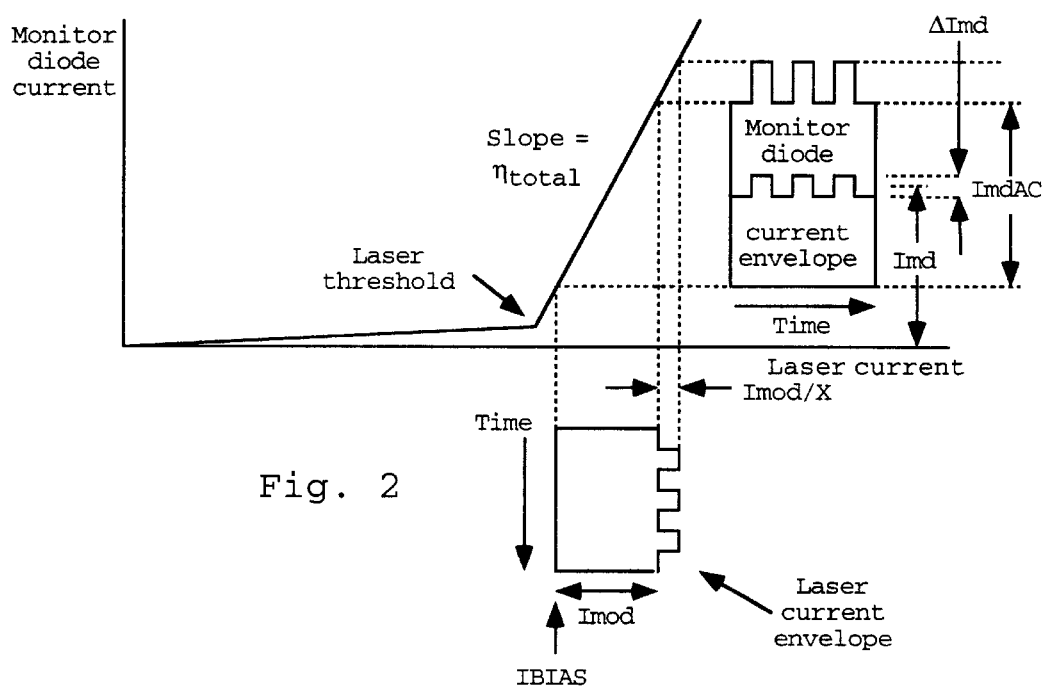
FIG. 2 graphically illustrates the relationship between laser currents and monitor diode currents.

Since the amplitude of the pilot tone current ripple during logic one bits is a known fixed fraction of the modulation current Imod, the amplitude of the optical power detected by the monitor photodiode is a known fixed multiple of the low frequency optical ripple amplitude ΔImd. The low frequency photodiode current is given as follows:

$$\Delta Imd = \eta_{total} \frac{ImdAC}{X} \frac{1}{2}$$

where ΔImd is the amplitude of the low frequency ripple detected at the monitor diode, which is proportional to the transmitted amplitude of the optical signal, ηtotal is the total slope efficiency from laser current to monitor diode current above threshold, ImdAC is the amplitude of the detected photodiode current, and X is the fixed fraction of modulation current to pilot tone current. The factor of two must be included because the photodiode detects the average optical signal. Since the logic zero bits are not modified by the pilot tone, the average power varies at half of the envelope amplitude. FIG. 2 graphically illustrates the relationships described above. In that Figure, the laser current envelope and the monitor diode current envelope epresent the envelopes, or upper ("1") and lower ("0") values of the high frequency data signal, which is too high in frequency to itself be illustrated in the Figure.

As mentioned above, this arrangement results in a transfer function of modulation current to ΔImd which remains monotonic, even if Imod is increased beyond the lasing threshold. This technique could be applied at IBIAS, resulting in a data envelope with ripple on both the logic one and logic zero. However, if the modulation current is increased beyond the lasing threshold, the low frequency ripple amplitude will decrease until the ripple on the logic zero is fully clipped. The may give the transfer function multiple possible operating points.

Figure 3:
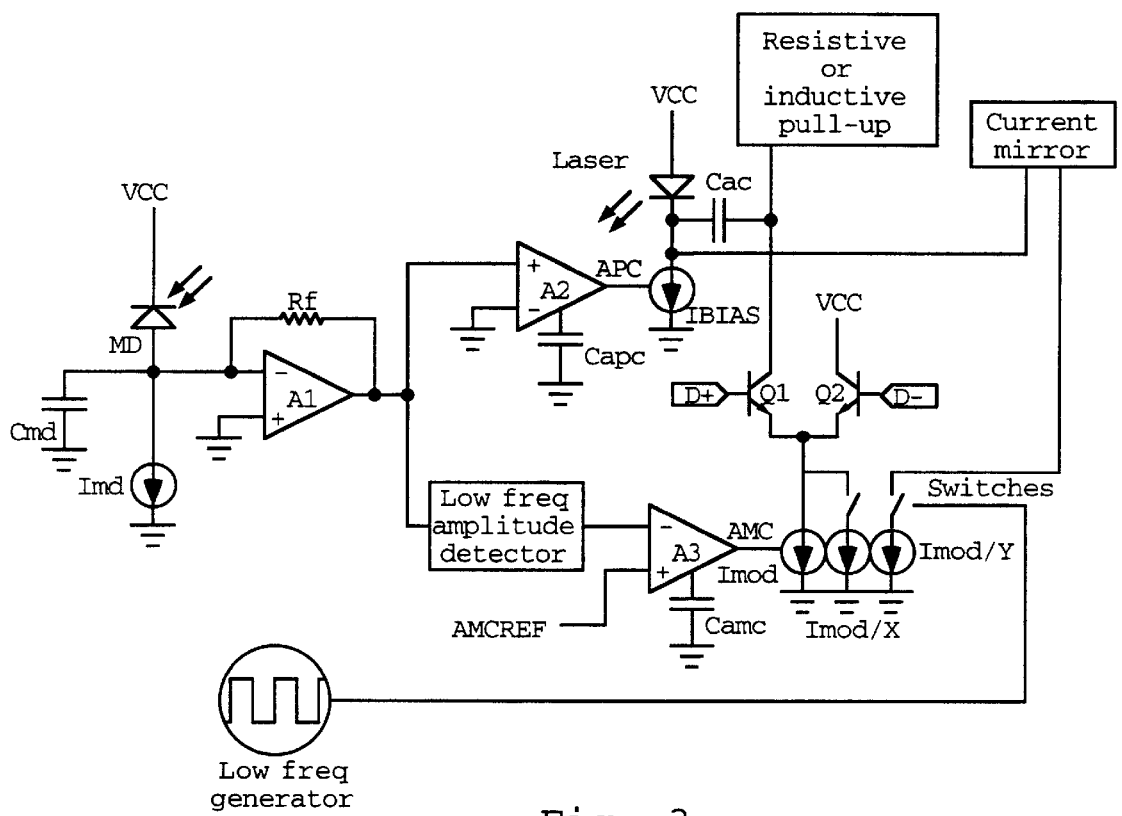
FIG. 3 is a schematic diagram of an alternate embodiment of the present invention for a laser having an AC coupled laser modulation current.
Figure 4:
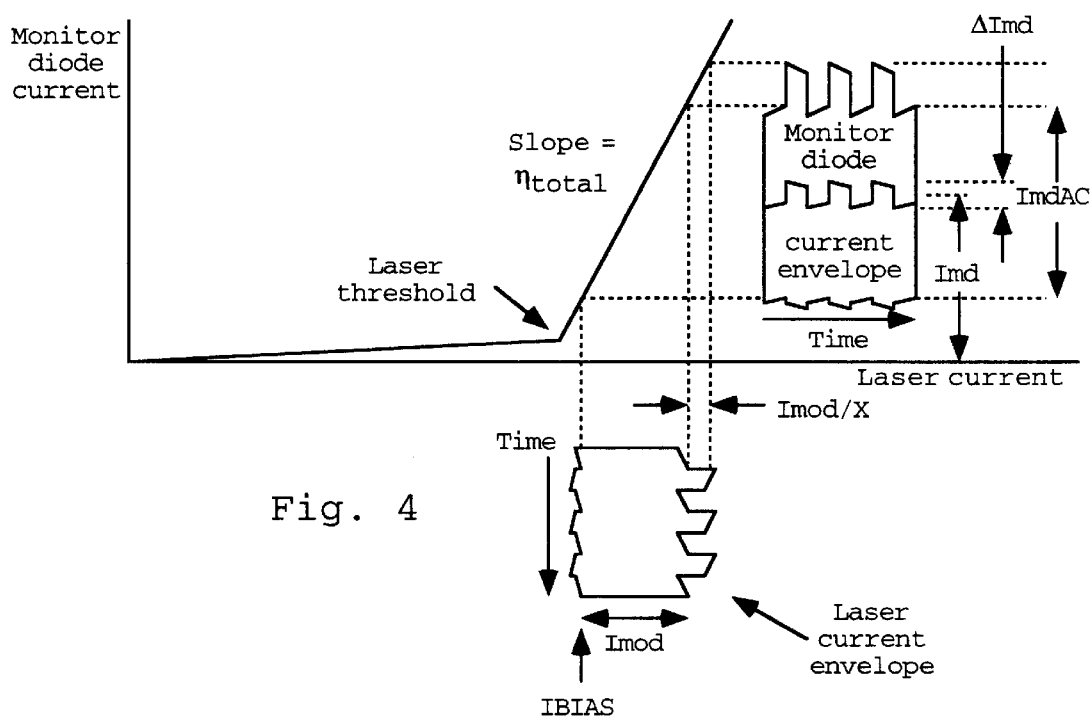
FIG. 4 graphically illustrates the relationship between laser currents and monitor diode currents for the AC coupled circuit of FIG. 3.

If the present invention is applied to a laser which has an AC coupled modulation current, such as capacitor Cac of FIG. 3, it is desirable to adjust the pilot tone frequency such that it remains above the cutoff of the AC coupling network. However, with this arrangement, a small amount of ripple will be apparent on the optical zero level due to droop of the AC coupling network. If this happens, multiple operating points or latch-up may still be a problem. If a small pilot tone Imod/Y with an amplitude equal to a fixed fraction Y of the modulation current is added with a 180 phase shift to IBIAS, this can be avoided by making the transfer function monotonic once again. Y can be set to 10% of X or smaller, as this is a second order effect. This modification is shown in the schematic of FIG. 3. As shown therein, a component of current Imod/Y is generated in addition to Imod/X. As these current components are generated by the circuit shown, they are in phase with each other. However, the current mirror shown reverses the phase of Imod/Y, converting the same to a true current source when Imod, as shown, actually acts as a current sink ("current source" is the phrase normally used in a general sense for both current sources and current sinks, current sources providing a current to another circuit and current sinks receiving or drawing a current from another circuit).

Figure 5:
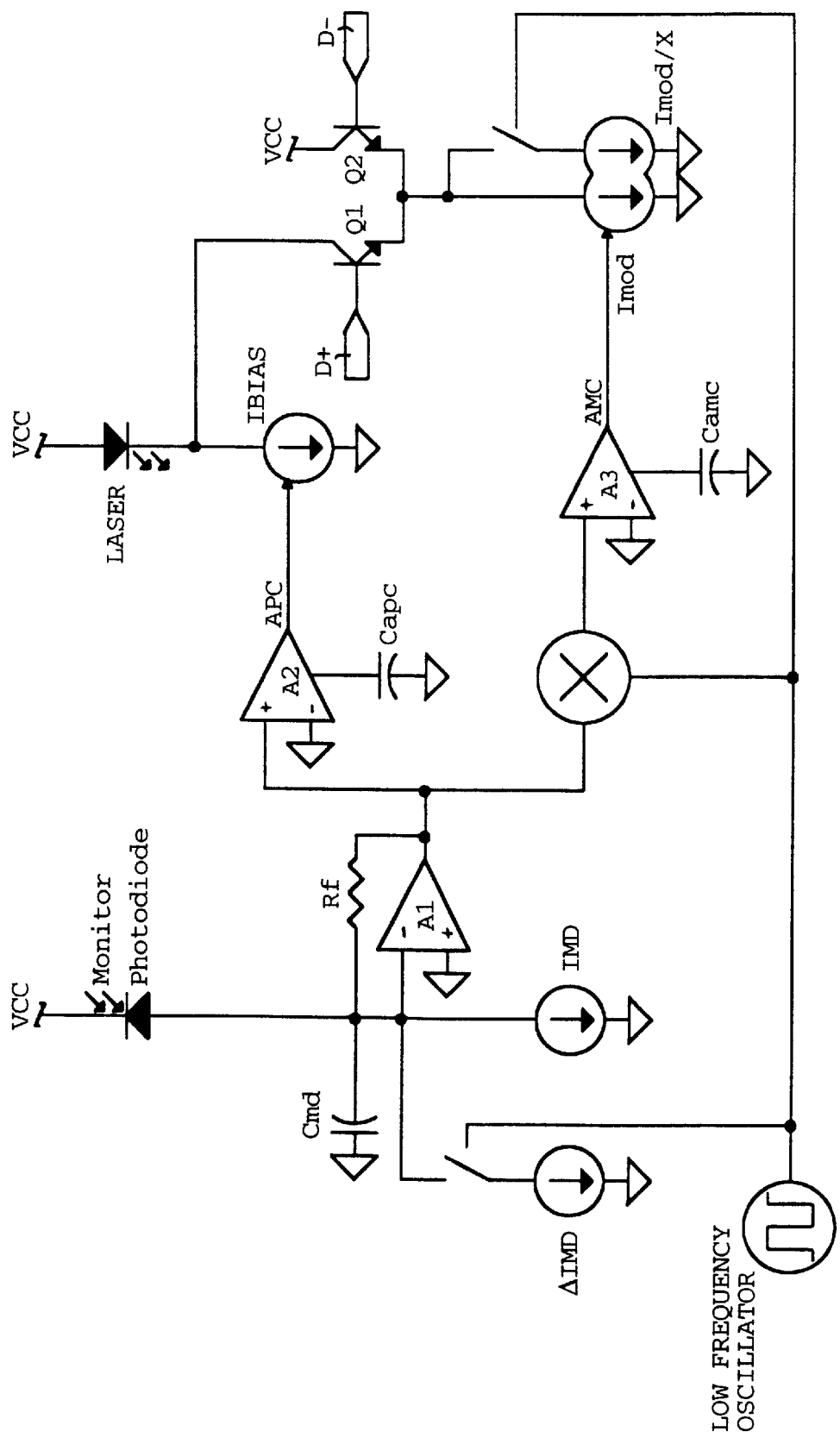
FIG. 5 shows modifications of FIG. 1 including synchronous detection and injection of the AC reference at the monitor diode input (an alternate embodiment).
Figure 6:
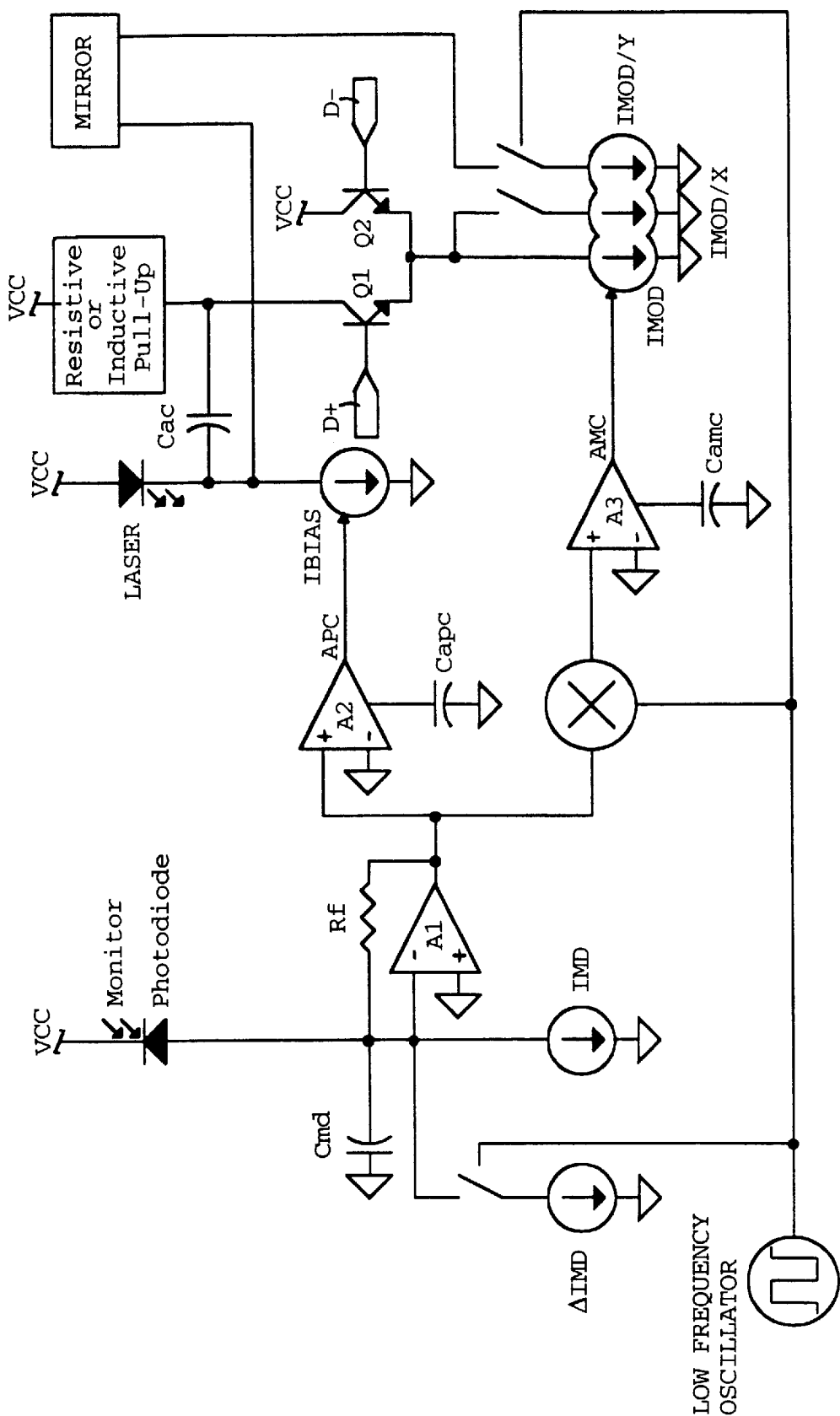
FIG. 6 is another alternate embodiment which incorporates improvements of both FIGS. 3 and 5.

Further modification can be made without changing the spirit of this invention. For example, the low frequency amplitude detector can be a peak detector or a synchronous amplitude detection circuit. Also, a signal representative of the desired monitor diode ripple signal ΔImd can be directly subtracted from the monitor diode current at the input of amplifier A1. This is illustrated in FIG. 5, which is a Figure similar to FIG. 1, but with the modification described, and FIG. 6, which is a Figure similar to FIG. 3, but with the modification described. In these cases, synchronous detection is required, and the inverting input of amplifier A3 should be connected to ground instead of a reference as described above. Thus while the present invention has been disclosed and described with respect to certain preferred embodiments, it will be understood to those skilled in the art that the present invention may be varied without departing from the spirit and scope of the invention.

What is claimed is:

1. A method of controlling a semiconductor laser having an average laser drive modulated by a laser drive signal to provide an optical signal comprising:

superimposing a pilot tone on the laser drive signal, the pilot tone being proportional to the laser drive signal;

sensing part of the optical signal from the laser to provide a measure of the average optical output of the laser and a measure of the variation in the optical output of the laser caused by the pilot tone;

controlling the average laser drive responsive to the average optical output of the laser to provide an average laser output; and, controlling the laser drive signal responsive to the variation in the optical output of the laser caused by the pilot tone to provide a predetermined variation in the optical output of the laser caused by the pilot tone, the controlling the laser drive signal being separate from the controlling the average laser drive.

2. The method of claim 1 wherein the control of the average laser drive to provide a predetermined average laser output operates with a time constant that is shorter than the control of the laser drive signal to provide a predetermined variation in the optical output of the laser caused by the pilot tone.

3. The method of claim 1 wherein the step of controlling the laser drive signal to provide a predetermined variation caused by the pilot tone is performed by sensing the amplitude of the optical signal from the laser caused by the pilot tone and controlling the laser drive signal based on a comparison of the last named amplitude to a reference amplitude.

4. The method of claim 1 wherein the step of controlling the laser to provide a predetermined average laser output comprises controlling the minimum laser drive to provide a predetermined average laser output.

5. The method of claim 1 wherein the pilot tone has a frequency which is substantially less than the frequency of the laser drive signal.

6. The method of claim 5 wherein the pilot tone has an amplitude that is not more than approximately 10% of the amplitude of the laser drive signal.

7. A method of controlling a semiconductor laser having an average laser drive modulated by a laser drive signal to provide an optical signal comprising:

providing a first controllable current through the laser;

providing a second controllable current through the laser, the second current being modulated between on and off conditions by an input signal;

providing a third current proportional to the second current through the laser, the third current also being modulated between on and off conditions by the input signal, the third current also being modulated between on and off conditions by a pilot tone, the pilot tone having a frequency which is less than the frequency of the input signal;

sensing part of the optical signal from the laser to provide a measure of the average optical output of the laser and to provide a measure of the variations in the optical output of the laser caused by the pilot tone;

controlling the first current to provide a predetermined average optical signal from the laser; and, controlling the second current to provide a predetermined variation in the optical signal from the laser caused by the pilot tone.

8. The method of claim 7 wherein the control of the first current to provide a predetermined average optical signal operates with a time constant that is shorter than the control of the second current to provide a predetermined variation in the optical signal from the laser caused by the pilot tone.

9. The method of claim 7 wherein the step of controlling the second current to provide a predetermined variation in the optical signal from the laser caused by the pilot tone is performed by sensing the amplitude of the optical signal from the laser caused by the pilot tone and controlling the second current based on a comparison of the last named amplitude to a reference amplitude.

10. The method of claim 7 wherein the step of controlling the first current to provide a predetermined average optical signal from the laser comprises controlling the minimum current through the laser to provide a predetermined average optical signal from the laser.

11. The method of claim 7 wherein the third current has an amplitude that is not more than approximately 10% of the amplitude of the second current.

12. The method of claim 7 wherein the second and third currents are capacitively coupled to the semiconductor laser.

13. The method of claim 12 further comprising a fourth current proportional to the third current, the fourth current being coupled across the semiconductor laser responsive to the pilot tone with a 180 phase shift with respect to the third current across the semiconductor laser as modulated responsive to the pilot tone.

14. A semiconductor laser and laser control system comprising:

a semiconductor laser;

a first controllable current source biasing the semiconductor laser;

a second controllable current source selectively switchable across the semiconductor laser responsive to an input signal;

a third current source proportional to the second current source and selectively switchable across the semiconductor laser responsive to a pilot tone of a frequency substantially lower than the frequency of the input signal and responsive to an input signal;

a sensor sensing part of the laser emission and providing a sensor output responsive thereto;

a first circuit responsive to the average sensor output controlling the first current source to maintain a predetermined average laser emission; and, a second circuit responsive to the variations in the sensor output at the pilot tone frequency controlling the second current source to maintain a predetermined laser emission at the pilot tone frequency.

15. The semiconductor laser and laser control system of claim 14 wherein the third current source is in parallel with the second current source and is also selectively switchable across the semiconductor laser responsive to an input signal.

16. The semiconductor laser and laser control system of claim 14 wherein the first circuit operates with a time constant that is shorter than the time constant of the second circuit.

17. The semiconductor laser and laser control system of claim 14 wherein the third current source is not more than approximately 10% as large as the second current source.

18. The semiconductor laser and laser control system of claim 14 wherein the second and third current sources are capacitively coupled to the semiconductor laser.

19. The semiconductor laser and laser control system of claim 18 further comprising a fourth current source proportional to the third current source, the fourth current source being switchable across the semiconductor laser responsive to the pilot tone with a 180 phase shift with respect to the third current source as switchable across the semiconductor laser responsive to the pilot tone.

20. A semiconductor laser control system comprising:

a first controllable current source for biasing a semiconductor laser;

a second controllable current source selectively switchable across a semiconductor laser responsive to an input signal;

a third current source proportional to the second current source and selectively switchable across a semiconductor laser responsive to a pilot tone of a frequency substantially lower than the frequency of the input signal and responsive to an input signal;

a sensor for sensing part of the emission of a semiconductor laser and providing a sensor output responsive thereto;

a first circuit responsive to the average sensor output controlling the first current source to maintain an average sensor output; and, a second circuit responsive to the variations in the sensor output at the pilot tone frequency controlling the second current source to maintain a predetermined sensor output at the pilot tone frequency.

21. The semiconductor laser control system of claim 20 wherein the third current source is in parallel with the second current source and is also selectively switchable across a semiconductor laser responsive to an input signal.

22. The semiconductor laser control system of claim 20 wherein the first circuit operates with a time constant that is shorter than the time constant of the second circuit.

23. The semiconductor laser control system of claim 20 wherein the third current source is not more than approximately 10% as large as the second current source.

24. The semiconductor laser control system of claim 20 wherein the second and third current sources are for capacitively coupling to a semiconductor laser.

25. The semiconductor laser control system of claim 24 further comprising a fourth current source proportional to the third current source, the fourth current source being switchable across the semiconductor laser responsive to the pilot tone with a 180 phase shift with respect to the third current source as switchable across the semiconductor laser responsive to the pilot tone.

* * * * *